(12) United States Patent
Fort et al.

(10) Patent No.: US 7,352,640 B2
(45) Date of Patent: Apr. 1, 2008

(54) HIGH-SPEED, SELF-SYNCHRONIZED CURRENT SENSE AMPLIFIER

(75) Inventors: Jimmy Fort, Aix en Provence (KR); Jean-Michel Daga, Peynier (FR)

(73) Assignee: Atmel Corporation, San Jose, CA (US)

( * ) Notice: Subject to any disclaimer, the term of this patent is extended or adjusted under 35 U.S.C. 154(b) by 86 days.

(21) Appl. No.: 11/463,391

(22) Filed: Aug. 9, 2006

(65) Prior Publication Data
US 2008/0037345 A1    Feb. 14, 2008

(51) Int. Cl.
*G11C 7/00*    (2006.01)
(52) U.S. Cl. ........................ 365/205; 365/210
(58) Field of Classification Search ................. 365/205, 365/210, 207, 208; 327/55, 57
See application file for complete search history.

(56) References Cited

U.S. PATENT DOCUMENTS

| | | | | |
|---|---|---|---|---|
| 5,138,579 A | * | 8/1992 | Tatsumi et al. | 365/185.25 |
| 5,258,959 A | * | 11/1993 | Dallabora et al. | 365/185.21 |
| 5,559,737 A | * | 9/1996 | Tanaka et al. | 365/185.25 |
| 5,771,197 A | | 6/1998 | Kim | |
| 6,608,787 B1 | | 8/2003 | Daga et al. | |
| 6,914,840 B2 | | 7/2005 | Agata | |
| 6,954,371 B2 | | 10/2005 | Hokari et al. | |

\* cited by examiner

*Primary Examiner*—Vu A. Le
(74) *Attorney, Agent, or Firm*—Schneck & Schneck; Thomas Schneck

(57) ABSTRACT

A sense amplifier circuit and a method for reading a memory cell. A circuit comprises a first bit line associated with a memory cell. A first input of a latch is coupled to the first bit line and a second input of the latch is coupled to a second node. There is a means for biasing the first input and the second input of the latch to a differential voltage between the first node coupled to the first bitline and the second node. There is also a means for switching the latch according to memory cell current. There is also a means for producing an output signal indicating the direction of switch. A method of reading a memory cell comprises precharging a first bit line which is associated with a memory cell. The memory cell current is driven according to the programmed state of the memory cell. Latch circuitry is biased based on a differential voltage between a first node coupled to the first bit line and a second node. The latch circuitry is then activated and the latch circuitry switches according to the memory cell current. An output signal indicating the direction of the latch circuitry's switch is then produced.

19 Claims, 4 Drawing Sheets

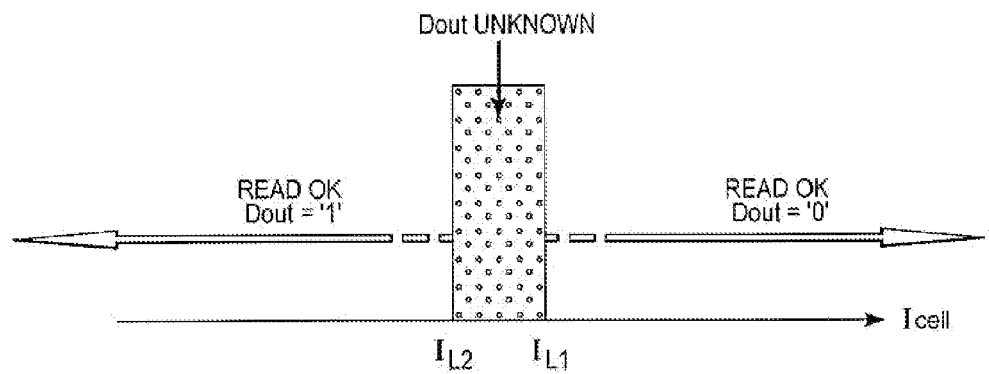
Fig._6
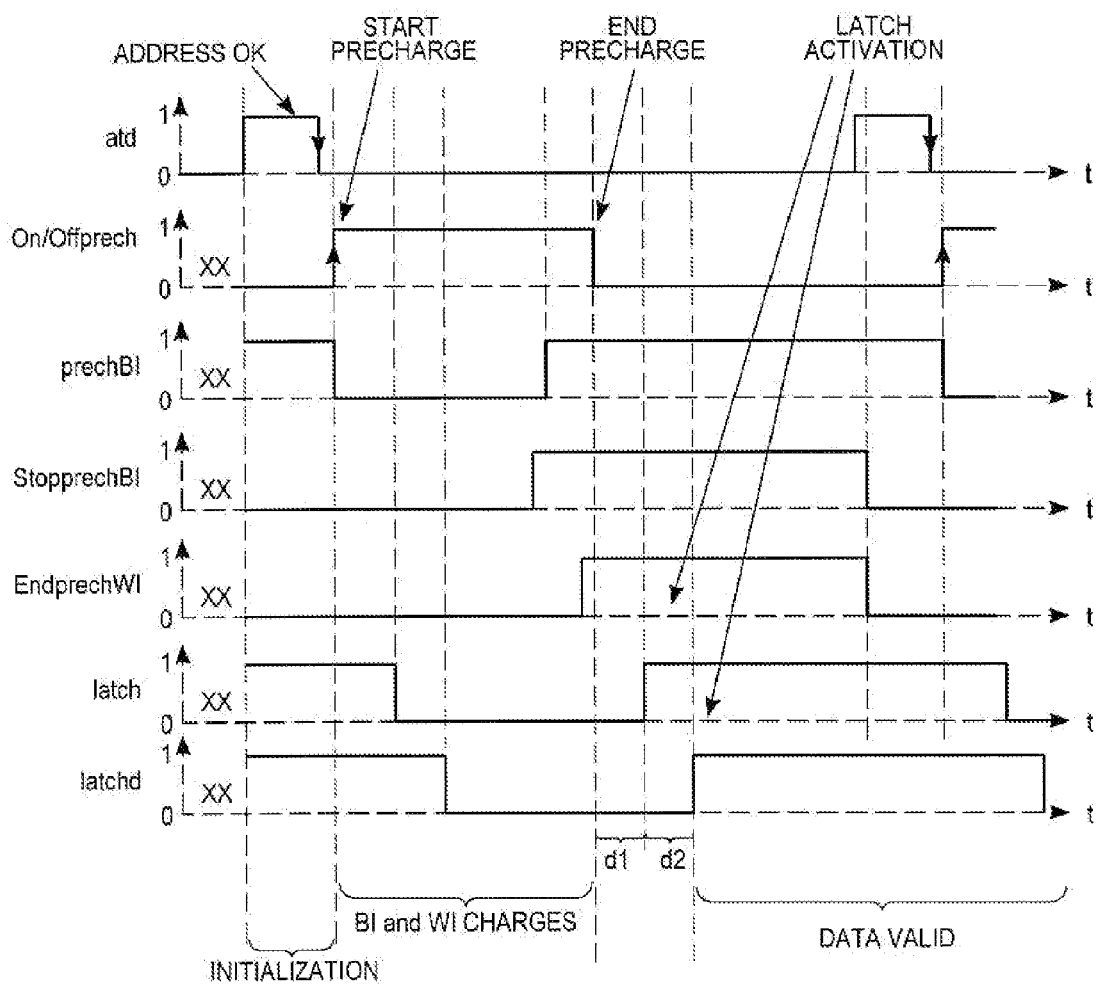
Fig._5

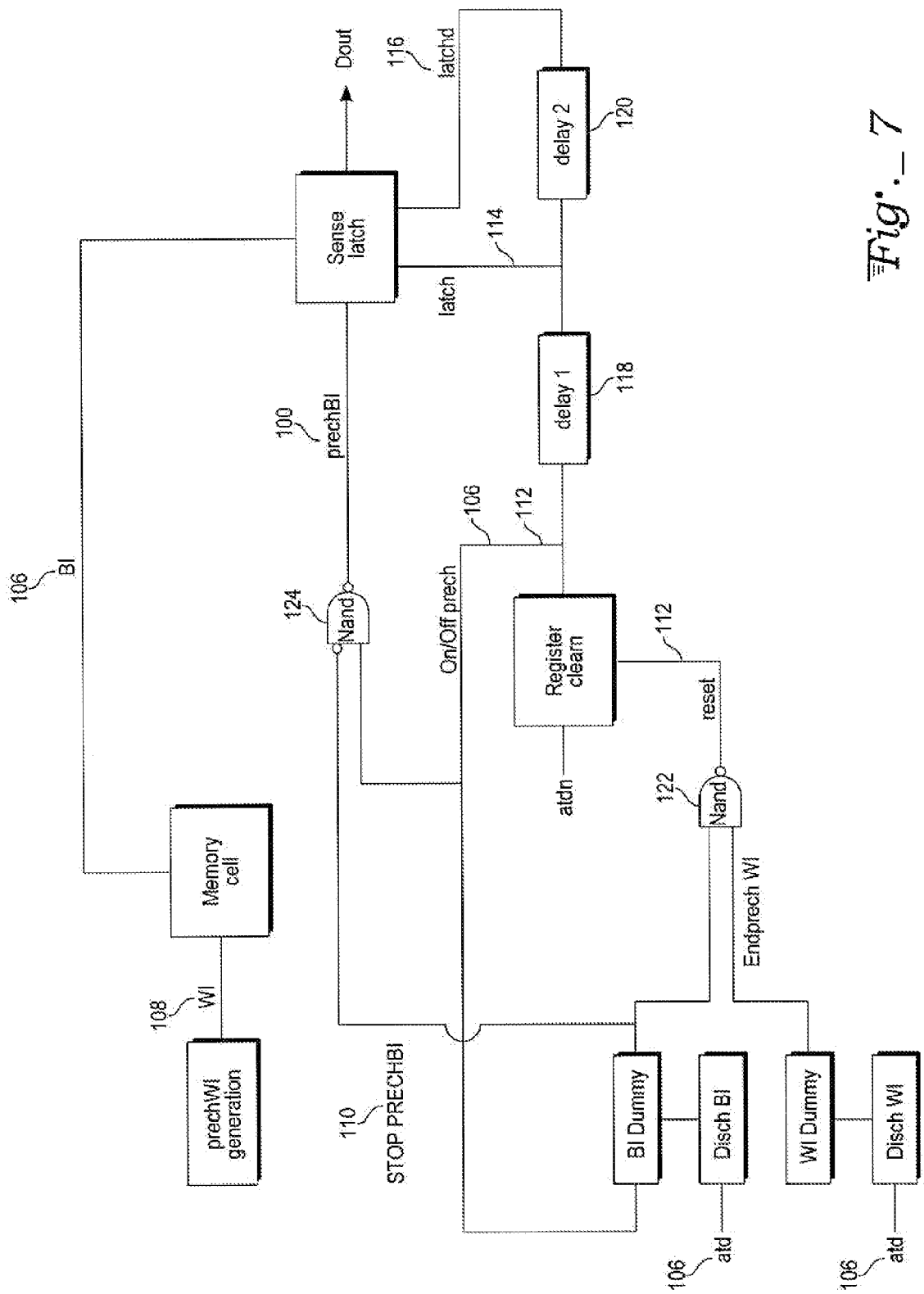
Fig. _ 7

HIGH-SPEED, SELF-SYNCHRONIZED CURRENT SENSE AMPLIFIER

TECHNICAL FIELD

The present invention relates to sense amplifiers for reading non-volatile memory cells.

BACKGROUND INFORMATION

In memory integrated circuits, sense amplifiers detect and determine the data content of a selected memory cell. In electrically erasable programmable read only memories ("EEPROM") and Flash memories, the sense amplifier serves two functions. First, the sense amplifier charges the bit line to a clamped value. Second, the sense amplifier senses the current flowing into the bitline due to the memory cell state. Both the reliability, in terms of endurance and retention, and the performance of the memory, in terms of access time and power consumption, are dependent on the design of the sense amplifier.

Usually, integrated sense amplifier structures are based on a differential amplifier comparing the current coming from the selected memory cell to the current of a reference cell. Reference cells can be implemented in a number of ways, including arrays of reference cells. A reference current may also be supplied by a "dummy" bit line equivalent to a standard bit line. When reference cells are employed, they are programmed once during the testing of the memory, increasing testing time.

In order to ensure good functionality of the sense, the ratio $I_{cell}/I_{ref}$, where $I_{cell}$ is the memory cell current and $I_{ref}$ is the reference current, must be maintained high enough to take account of process fluctuations in the memory and references cells as well as the impact of memory cycling. It has been shown that the speed, performance, and reliability of standard differential amplifier sense amplifiers are highly reduced for supply voltages less than 2 V.

In general, previous attempts to design sense amplifiers that do not employ reference cells are fully asynchronous and are not very suitable at a low supply voltage (i.e., $V_{DD}$<1.2 V). Therefore, it would be desirable to have an improved sense amplifier design.

SUMMARY OF THE INVENTION

In one embodiment, a method of reading a memory cell comprises precharging a first bit line coupled to the memory cell. The memory cell is driven according to a programmed state of the memory cell. Latch circuitry is biased based on a differential voltage between a first node coupled to the bit line and a second node. The latch circuitry is activated and switches according to the memory cell current. An output signal indicating a direction of the latch circuitry switch is produced.

In another embodiment, a circuit comprises a first bit line coupled to a memory cell. There is a means for biasing a first input and second input of a latch to a differential voltage between a first node coupled to the first bit line and a second node. There is also a means for switching the latch according to memory cell current and a means for producing an output signal indicating a direction of the switch.

In yet another embodiment, a circuit comprises a first bit line coupled to a memory cell. A first input of a latch is coupled to the first bit line and a second input of the latch is coupled to a second node. Latch biasing circuitry is configured to bias the first input and second input of the latch to a differential voltage between a first node coupled to the bit line and the second node, the latch configured to switch after activation, the switch made according to memory cell current.

BRIEF DESCRIPTION OF THE DRAWINGS

FIG. 5 is a timing diagram of one embodiment of the invention.

FIG. 6 is a block diagram showing a detectable range of memory cell current.

FIG. 7 is a block diagram showing sequencing circuitry of one embodiment of the invention.

DETAILED DESCRIPTION OF THE INVENTION

Figure 1:
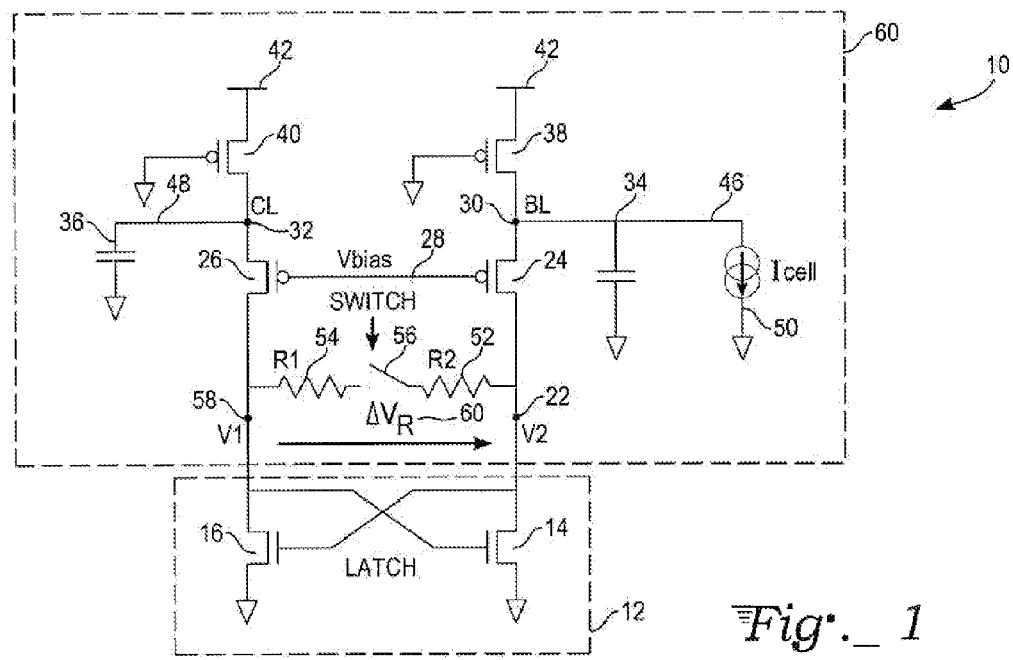
FIG. 1 is an electrical schematic diagram of one embodiment of the invention.

FIG. 1 shows one embodiment of the sense circuit 10 featuring a latch 12 and latch biasing circuitry 60. The latch 12 has two NMOS transistors 14, 16. The source terminal of each of the NMOS transistors 14, 16 is coupled to a ground potential, and the gate of each NMOS transistor 14, 16 is coupled to the drain terminal of the other NMOS transistor 14, 16 of the latch.

In the latch biasing circuitry 60, a bit line 46 associated with a memory cell (not shown) has a capacitor 34. The source terminal of PMOS transistor 38 is coupled to $V_{DD}$ 42 and its drain terminal coupled to the bit line 46 at node BL 30. The gate of the PMOS transistor 38 is coupled to a ground potential. The source terminal of PMOS transistor 24 is coupled to the drain terminal of PMOS transistor 38. The gate of PMOS transistor 24 is coupled to the gate of PMOS transistor 26 (discussed below). A resistor 52 is coupled to the drain of PMOS transistor 24. Resistor 52 is coupled to switch 56 which is coupled to resistor 54.

A dummy bit line 48 has a capacitor 36. The source terminal of PMOS transistor 40 is coupled to $V_{DD}$ 42 and the drain terminal of the PMOS transistor 40 is coupled to the dummy bit line 48 at node CL 32. The source terminal of PMOS transistor 26 is coupled to the drain terminal of PMOS transistor 40. The drain terminal of PMOS transistor 26 is coupled to resistor 54 and the gate of PMOS transistor 26 is coupled to the gate of PMOS transistor 24.

The latch 12 is coupled to the latch biasing circuitry 60. The drain terminal of PMOS transistor 24 is coupled to the drain terminal of NMOS transistor 14 while the drain terminal of PMOS transistor 26 is coupled to the drain terminal of NMOS terminal 16. The voltage terminal at the drain of NMOS transistor 14 is V2 22. The voltage at the drain terminal of NMOS transistor 16 is V1 58.

Figure 2:
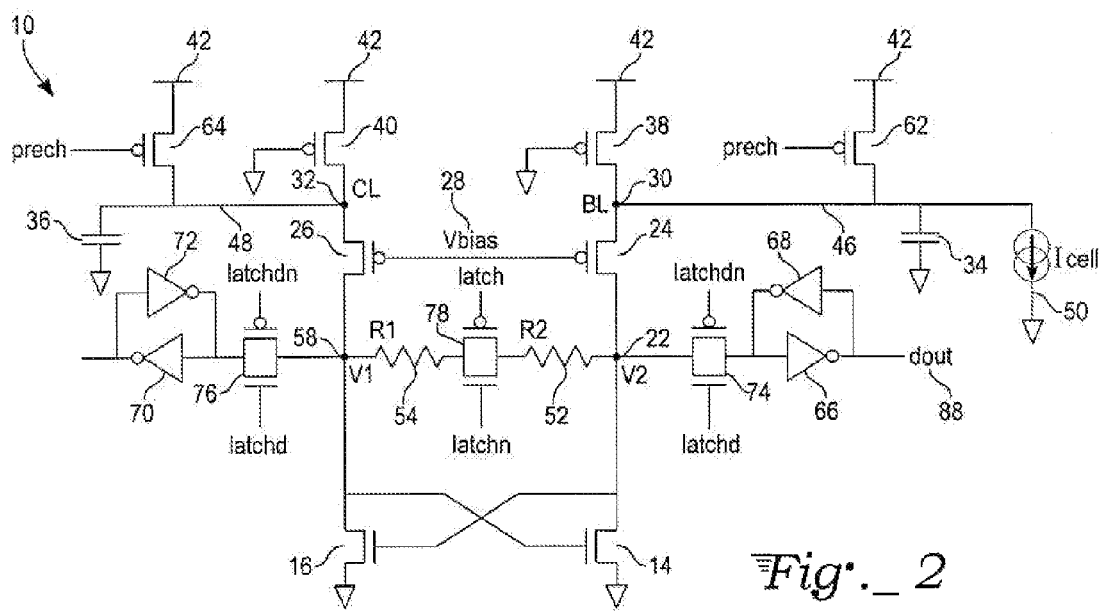
FIG. 2 is an electrical schematic diagram of one embodiment of the invention.

With regard to FIG. 2, the sense circuit 10 includes precharging circuitry. In one embodiment, PMOS transistors 62, 64 have source terminals coupled to supply voltage $V_{DD}$ (in one embodiment, supply voltage $V_{DD}$ is 1.2 V; other voltages may be used in other embodiments). The gates of these transistors 62, 64 are coupled to a precharge signal line. The drains of transistors 62, 64 are coupled to the bit line 46 and dummy bit line 48, respectively. In this embodiment, the bit line decoder (not shown) couples the precharge circuitry to the bit line. Any bit line decoder known to those of skill in the art may be employed with the sense circuitry.

Figure 3:
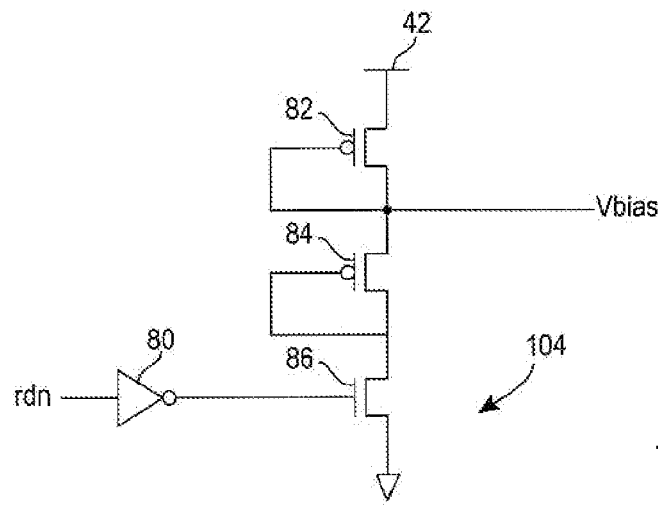
FIG. 3 is an electrical schematic diagram of one embodiment of circuitry to provide a bias voltage to the circuit of FIG. 2.

In FIG. 3, one embodiment of the circuitry 104 to generate bias voltage for the sense circuit is shown. The source terminal of a PMOS transistor 82 is coupled to $V_{DD}$ 42 and the drain terminal of the PMOS transistor 82 is coupled to the gate of the PMOS transistor 82 and the source terminal of another PMOS transistor 84. The drain terminal of the PMOS transistor 84 is coupled to the gate of the PMOS transistor 84 and the drain terminal of NMOS transistor 86, whose source terminal is coupled to a ground potential. The gate of NMOS transistor 86 is coupled to an inverter 80. The inverter 80 input is the rdn signal, which is low during a read operation. During a read operation, the circuitry 104 produces an output signal, vbias, or bias voltage, which is supplied to the gates of PMOS transistors 24 and 26 of the sensing circuitry in FIGS. 1 and 2.

Returning to FIG. 2, the signals which control latches 74, 76, and 78 are shown. Latch 78 is controlled by the signals latch and latchn. The latchn signal is an inversion of the latch signal. Latches 74 and 76 are controlled by the latchd and latchdn signals. The latchdn signal is an inversion of the latchd signal. The timing of these signals will be discussed in greater detail below in FIG. 5.

Figure 4:
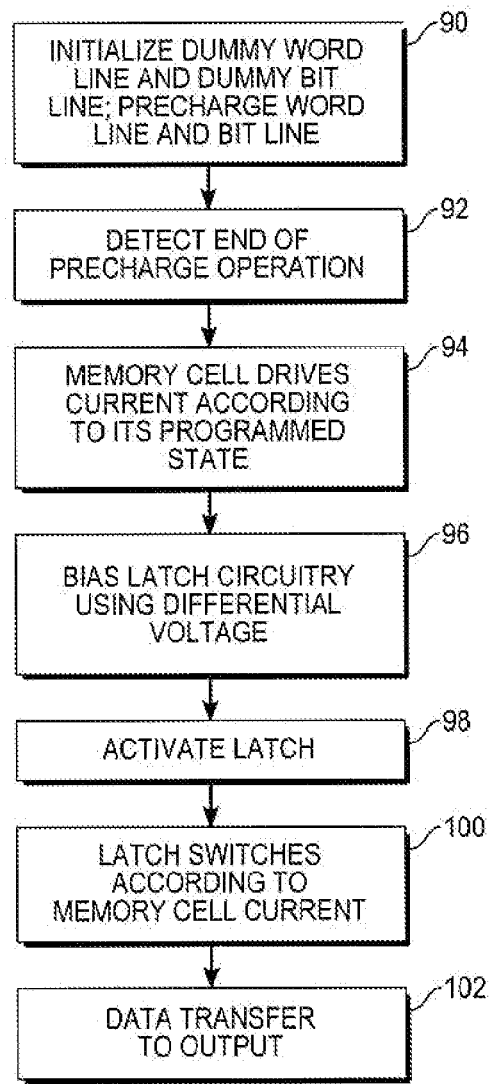
FIG. 4 is a flow chart showing one embodiment of the operation of the invention.

In one embodiment, shown in FIG. 4, the read operation of a memory cell begins with initializing the dummy bit and word lines (by discharging the lines), precharging a dummy word line and a dummy bit line, and precharging the word line and bit line associated with the memory cell to be read (block 90). The end of the precharge operation is detected by detection circuitry (an exemplary embodiment of which is discussed below in FIG. 7) (block 92). At the end of the precharge operation, the memory cell is correctly biased for read. The memory cell drives a current according to its programmed state (i.e., the current will vary depend on whether the memory cell is programmed with a "1" or "0") (block 94). The memory cell current creates a voltage variation on the bit line. This is a current to voltage conversion on the bit line. This voltage variation is amplified by the latch biasing circuitry and the inputs of the latch are biased with a differential voltage (discussed below) (block 96). The latch is then activated (block 98). The latch then switches according to the memory current (block 100). An output signal indicating the result of the read operation is then produced (block 102).

A timing diagram of one embodiment is shown in FIG. 5. The read operation begins with an address transition detection ("atd") signal. (For purposes of simplicity, standard address transition detection circuitry is not shown in FIGS. 2 and 3 but is well-known to those of skill in the art.) The atd signal pulse is obtained using standard address transition detection circuitry. The atd signal goes low after an internally controlled delay (the signal stays high as long as the input address bits are toggling). The pulse delay on the atd signal is used to discharge the dummy bit line and dummy word line during the initialization phase. Once this initialization phase has occurred, the precharge operation starts. After the address is verified, the prech signal goes high to begin the precharge operation. During the precharge operation, the bit line is precharged (when the signal prechBl goes low). Once the dummy bit line reaches the desired precharge voltage (this is detected by circuitry connected at the end of the dummy bit and word lines, which, for purposes of simplicity, is not shown in either FIGS. 1 or 2, but would be well-known of skill to the art, the precharging of the bit lines and word lines is stopped by the signals StopprechBl and EndprechWl going high. The prech signal then goes low to end the precharge operation. Delay signals d1 and d2 are added by delay circuitry to provide delays between the end of the precharge and latch biasing operations and the beginning of the latch activation operations (i.e., the latch signal going high and then the latchd signal going high). (In one embodiment, d1 is less than 5 nanoseconds while d2 is less than 2 ns. However, these delays may vary in other embodiments.) Delay d1 is the biasing latch time and delay d2 is a security delay (communication latch time) before latching data out. After the precharge operation ends, the latch and latchd signals go high during the latch activation period. While the latchd signal is high, the latch data is valid. The access time (the time required for a read operation) is derived as follows:

Access time=Initialization delay+Precharge delay+
Latch biasing delay+Latching delay+Dataout
delay Returning to FIG. 2, switch 78 is on during the precharge and biasing operations. A current can flow through the resistors R1 54 and R2 52 and the switch 78. Resistors R1 54 and R2 52 are of equivalent value (R1=R2=R). At the end of the precharge operation, the nodes BL 30 and CL 32 are set to their precharge voltage. The precharge voltage on node BL 30 is equal to $V_{DD}-R_P \cdot Ibias2$, where Ibias2 is the current flowing through PMOS transistor 24 and $R_P$ is the equivalent resistance of PMOS transistor 38 biased in linear mode. On node CL 32, the precharge voltage is equal to $V_{DD}-R_P \cdot Ibias1$, where Ibias1 is the current flowing through PMOS transistor 26 and $R_P$ is the equivalent resistance of PMOS transistor 40 biased in linear mode. In one embodiment, the precharge voltage is $V_{DD}-100$ mV. Other precharge voltages may be used in other embodiments. Both of the voltages on nodes BL 30 and CL 32 may be made very close to $V_{DD}$ through selection of structure size.

Since Ibias1 is not equal to Ibias2, there is a current imbalance in the circuit. A current $I_{Rinit}$ flows through R1 54, R2 52, and the switch 78. Current $I_{Rinit}$ fixes the DC biasing conditions of the latch following the precharge operation. In one embodiment, an initial voltage $V_{Rinit}=V2-V1=(R1+R2+R_{switch})I_{Rinit}=(2R+R_{switch})$ (again, this assumes that R1=R2=R). The current imbalance is obtained by selecting the size of certain elements of the circuitry. For example, the drive of PMOS transistor 24 can be tuned to be larger than the drive of PMOS transistor 26 by appropriately selecting the size of the transistors 24 and 26 (or transistors 38, 40). In one embodiment, given the voltages at nodes V2 22 and V1 58, a positive differential DC voltage is obtained at the inputs of the latch.

As noted above, the memory cell current can change the voltage on the bit line 46. The voltage variation at node BL 30 due to the memory cell current, Icell, can be explained as:

$$\Delta V_{BL} = -\left(\frac{Rp}{Rp \cdot gm_{p24} + 1}\right) \cdot Icell$$

where Rp is the equivalent resistance of transistor 38 biased in linear mode and $gm_{p24}$ is the transconductance of transistor 24 biased in saturation mode. Since there is no memory cell on the dummy bit line 48, node CL 32 is stable at its precharge value.

The voltage variation on the bit line 46 generates an amplified variation at the inputs of the latch thanks to the biasing circuitry. The variation of differential voltage $V_R$ due to the cell current can be expressed (by neglecting $g_{ds}$) as:

$$\Delta V_R = -\frac{gm_{p24}}{(gm_{p24} + G_p) \cdot \left(\frac{G \cdot gm_{N14}}{gm_{N16}} - gm_{N14} + G\right)} \cdot Icell = f \cdot Icell$$

where $Gp=1/Rp$, $gmN16$ and $gmN14$ are the transconductances of transistors 16 and 14, respectively, and $$G = \frac{1}{2R + R_{switch}} = \frac{1}{2R},$$

where $R=R1=R2$ and $R_{switch}$ is the equivalent resistance of the switch 78 (which can be made negligible compared to R). Based on the above equations, the following is obtained:

$$G \geq \frac{gm_{N16} \cdot gm_{N14}}{gm_{N16} + gm_{N14}}$$

This expression is used to correctly size the resistance R.

At the end of the precharge operation (after memory cell current is flowing), the inputs of the latch are biased to a differential voltage value. The value of this differential voltage $V_R$ is:

$$V_R = V_{Rinit} - \Delta V_R = V_{Rinit} - f \cdot Icell$$

When the inputs of the latch are correctly biased to the DC $V_R$ value, the latch circuitry can be activated. To activate the latch, the switch 78 must be OFF. Once activated, the latch switches according to the initial DC input conditions given by $V_R$. The latch switching operation is very fast due to positive feedback. If the NMOS transistors 14, 16 in the latch are perfectly identical (i.e., there is no mismatch is the latch circuitry), the theoretical condition to get a correct latch switching operation is $|V_R| \geq 0$, where $|V_R|$ is the absolute value of the differential voltage $V_R$. However, given a mismatch between transistors 14 and 16, the practical condition for a latch switching operation is $|V_R| \geq 3 \cdot \sigma_{VTN}$, where $\sigma_{VTN}$ is the standard deviation of the threshold voltage ("VTN") of NMOS transistors 14 and 16. This condition ensures the latch will switch correctly in the direction imposed by the biasing of the latches with $V_R$ at the end of the precharge operation. If $V_R$ is negative, i.e., V2<V1, then V2 will go low while V1 will go high. If $V_R$ is positive, i.e., V2>V1, then V2 will go high while V1 goes low.

In order to be correctly sensed by the sense circuitry, the memory cell current should meet certain conditions. Given the practical condition for a latch switching operation (as discussed above) $|V_R| \geq 3 \cdot \sigma_{VTN}$, the following is obtained: $3 \cdot \sigma_{VTN} < V_{Rinit} - f \cdot Icell < -3 \cdot \sigma_{VTN}$, resulting in the following conditions for the memory cell current:

$$\text{Condition 1:} \quad Icell > \frac{3\sigma_{VTN} + V_{Rinit}}{f} = I_{L1}$$

$$\text{Condition 2:} \quad Icell < \frac{3\sigma_{VTN} - V_{Rinit}}{f} = I_{L2}$$

If condition 1 is fulfilled, V2 will go low when the latch is activated. If condition 2 is fulfilled, the latch will switch in the opposite direction and V2 will go high. As shown in FIG. 6, in some embodiments, if the memory cell current is between $I_{L1}$ and $I_{L2}$, the latch output is unknown due to mismatching devices.

With regard to FIG. 2, identical structures are on the output nodes V1 58 and V2 22 to match or closely match the capacitances on these nodes 58, 22. The voltage on node V2 22 is transferred to the dout node 88 once the sensing operation has been performed (i.e., the latch switching operation has occurred). Switch 74 is activated by the latchd and latchdn signals. The signal passing through switch 74 is inverted 66 and before the output signal is transferred to the dout node 88. As has been discussed above, the output switches 74, 76 are off during the sensing operation. Data transfer to the output node 88 occurs when the latchd and latchdn signals activate the output switches 74, 76 (for example, latchd is set to "1" while latchdn is set to "0").

Sequencing circuitry is shown in FIG. 7. The atd signal controls the bit and word line discharge circuitry used for initialization (block 106). The precharge circuitry then precharges the dummy bit line and dummy word line as well as the bit line and word line (block 108). Once the dummy bit line and dummy word line are precharged, the signals EndprechWl and StopprechBl are set to high and the reset signal is set to low. The output of the register goes low and NAND cell 124 sets signal prechBl high to stop precharge of the bitline (block 110). The precharge operation is turned off when the EndprechWl signal goes high (block 112). A NAND cell 122 is used to activate the circuitry to generate delays. A first delay signal d1 is asserted on a delay line (block 118) between the end of the precharging operation and the latch signal going high (block 114), at which time data is read. A second delay signal d2 is asserted on another delay line (block 12) before the latch d signal goes high (block 116), at which time data is valid. In one embodiment, the register is a D flip flop with clear (the register is clear when the reset signal is low). The delay circuits are inverters with capacitors.

The sense circuit described above is able to operate at very low supply voltages (for instance, 1.2 V, though other voltages (greater and smaller than 1.2 V) may be used). The circuit also provides for perfect control of the latch DC biasing conditions before latch activation. The circuit also consumes little power (for example, 15 µA per sense in 0.13 µm technology has been achieved). The circuitry is self-synchronized and there is no need for an external clock.

The sense circuit described above may have different configurations in other embodiments. For instance, dummy bit lines and dummy word lines are not required. Instead of a dummy bit line, a capacitor nearly equal to the bit line capacitor can be used.

What is claimed is:

1. A method of reading a memory cell, the method comprising:
   a) precharging a first bit line, the first bit line coupled to the memory cell;
   b) driving memory cell current according to a programmed state of the memory cell;
   c) biasing latch circuitry based on a differential voltage between a first node coupled to the bit line and a second node;
   d) activating the latch circuitry;
   e) switching the latch circuitry according to the memory cell current;

f) producing an output signal indicating a direction of the latch circuitry switch.

2. The method of claim 1 further comprising detecting an end to a precharging operation.

3. The method of claim 1 further comprising precharging a second bit line, the second bit line coupled to the second node.

4. The method of claim 1 further comprising delaying activating the latch circuitry.

5. The method of claim 1 further comprising performing a current to voltage conversion.

6. A circuit comprising:
 a) a first bit line coupled to a memory cell;
 b) means for biasing a first input and a second input of a latch to a differential voltage between a first node coupled to the first bit line and a second node;
 c) means for switching the latch according to memory cell current; and
 d) means for producing an output signal indicating a direction of the switch.

7. The circuit of claim 6 further comprising means for precharging the first bit line.

8. The circuit of claim 7 further comprising means for precharging a second bit line, the second bit line coupled to the second node.

9. The circuit of claim 7 further comprising means for detecting an end of a precharging operation.

10. The circuit of claim 6 further comprising means for activating the latch.

11. The circuit of 8 further comprising means for initializing the second bit line.

12. The circuit of claim 6 wherein the circuit is self-synchronized.

13. A circuit comprising:
 a) a first bit line coupled to a memory cell;
 b) a latch, a first input of the latch coupled to a first node coupled to the first bit line and a second input of the latch coupled to a second node; and
 c) latching biasing circuitry configured to bias the first input and second input of the latch to a differential voltage between a first node coupled to the first node and the second node, the latch configured to switch after activation, the switch made according to memory cell current.

14. The circuit of 13 further comprising precharging circuitry configured to precharge the first bit line.

15. The circuit of 13 further comprising a second bit line coupled to the second node.

16. The circuit of 14 wherein the precharging circuitry is further configured to precharge the second bit line.

17. The circuit of 14 further comprising detection circuitry configured to detect an end of a precharging operation.

18. The circuit of 15 further comprising initialization circuitry configured to initialize the second bit line.

19. The circuit of claim 13 wherein the latch is comprised of two NMOS transistors.

* * * * *

UNITED STATES PATENT AND TRADEMARK OFFICE
CERTIFICATE OF CORRECTION

PATENT NO. : 7,352,640 B2 Page 1 of 1
APPLICATION NO. : 11/463391
DATED : April 1, 2008
INVENTOR(S) : Fort et al.

It is certified that error appears in the above-identified patent and that said Letters Patent is hereby corrected as shown below:

On the face page, in field (75), in "Inventors", in column 1, line 1, delete "(KR)" and insert -- (FR) --, therefor.

In column 6, line 36, delete "latch d" and insert -- latchd --, therefor.

Signed and Sealed this

Seventh Day of October, 2008

JON W. DUDAS
*Director of the United States Patent and Trademark Office*